United States Patent

[11] 3,594,490

[72] Inventors Leonard A. Mitchell
Endwell, N.Y.;
Arvindlal M. Shah, Raleigh, N.C.
[21] Appl. No. 55,871
[22] Filed July 17, 1970
[45] Patented July 20, 1971
[73] Assignee International Business Machines Corporation
Armonk, N.Y.

[54] ELECTRONIC GROUNDING SYSTEM
10 Claims, 7 Drawing Figs.

[52] U.S. Cl. 174/35 MS, 174/35 GC, 174/51
[51] Int. Cl. H05k 9/00
[50] Field of Search 174/35, 35 GC, 35 MS, 51

[56] References Cited

UNITED STATES PATENTS

| | | | |
|---|---|---|---|
| 3,231,663 | 1/1966 | Schwartz | 174/35 MS |
| 3,296,356 | 1/1967 | McAdams | 174/35 GC |

*Primary Examiner*—Darrell L. Clay
*Attorneys*—Hanifin and Jancin and Carl W. Laumann, Jr.

ABSTRACT: A grounding system for electronic unit. A metallic frame has a protective coating of nonmetallic conductive paint. Metal strips, having a substantial area in contact with the conductive paint, coact with the conductive paint to provide a low-impedance path to the frame.

INVENTORS
LEONARD A. MITCHELL
ARVINDLAL M. SHAH
BY [signature]
ATTORNEY

ELECTRONIC GROUNDING SYSTEM

BACKGROUND OF THE INVENTION

Electronic devices, such as digital computers, which operate on low-level signals are quite susceptable to erratic operation in the presence of electrical noise. Even in those applications where electrical noise from machines or power lines is not present there is the noise created by electrostatic discharges between the equipment and operating personnel. Since these electronic devices generate electrical noise themselves, it is necessary to maintain spurious electromagnetic radiation at the lowest possible level.

Such requirements have been satisfied in the past by electroplating the main frame to provide a low resistance, corrosion-proof coating in combination with the use of finger stock or similar material to make a connection between doors and the frame. Electroplating was the only satisfactory method of applying a suitable metallic coating to the frame. The requirements for low electrical resistance and the ability to preserve this characteristic in corrosive environments led to the use of cadmium plating, tin-lead coatings and similar materials.

Such platings were completely effective to provide a low impedance path from the finger stock to the frame, allowing rapid dissipation of electrostatic charges applied to the outside of the unit and also attenuating electrical noise. The use of plated coatings was unduly expensive and each new frame required special tanks or fixtures to assure an even deposition over the complex structure.

The necessity for such tanks, fixtures and other capital equipment made plating uneconomical where a small number of frames was involved. Furthermore, once a plating line was set up, changes in frame design became prohibitively expensive. These difficulties led most manufacturers of electronic devices to seek out a plating specialist for this operation. The resulting inconvenience and increased inventory requirements make such arrangements the lesser of two evils.

SUMMARY OF THE INVENTION

In the preferred embodiment of the invention a plated metallic coating on the frame is replaced with a conductive paint. Since the paint may be applied with a brush or by spraying, there is no need for extensive capital equipment. The use of a paint based on a modified phenol formaldehyde resin provided the necessary corrosion resistance. The conductivity requirement was partially satisfied by the addition of carbon particles. It was not possible to develop a paint having conductivity to match cadmium, nickel or similar plating material. However, by placing high-conductivity strips in contact with large areas of paint, the resistance from the trip to the frame becomes very much lower due to the effective paralleling of the paint contact resistances. In other words, while the resistance through a section of paint 1 mm. square may be quite high, the resistance of many such squares in a parallel connection is substantially less and may even approach that of a metallic plating.

The use of the high-conductivity strip achieves the necessary parallel connection. Conventional finger stock can then be used to make contact with the high-conductivity strip.

The high-conductivity strip can be attached to the painted frame by mechanical means such as rivets or screws. As an alternative to mechanical fasteners, a conductive adhesive may be used. Such adhesives lend themselves particularly well to the attachment of very thin strips such as metallic tape.

It is therefore an object of this invention to provide an improved grounding system for electronic equipment.

It is another object of this invention to provide a grounding system for electronic equipment which does not require electroplating the frame.

It is still another object of this invention to provide a grounding system for electronic equipment which allows electroplated finishes to be replaced with paint.

Still another object of this invention is to provide a grounding system utilizing conductive paint.

The foregoing and other object, features and advantages of the invention will be apparent from the following more particular description of preferred embodiments of the invention as illustrated in the accompanying drawings.

Figure 1:
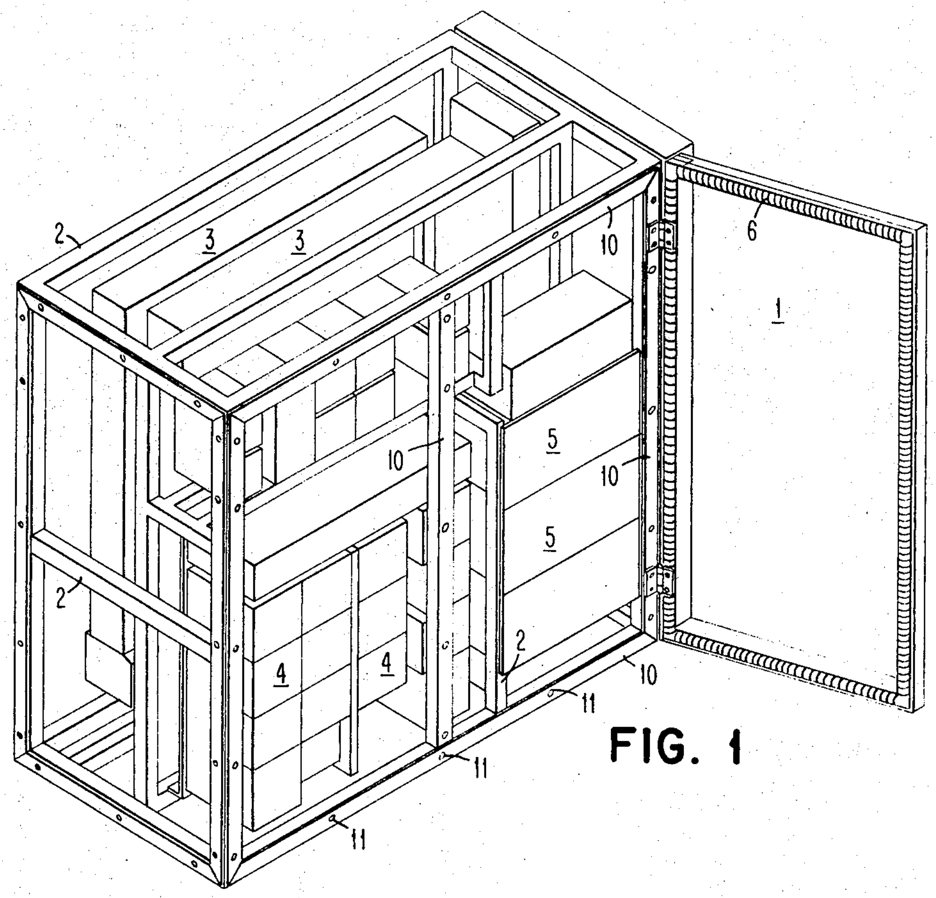
FIG. 1 is an isometric view of a digital computer with covers removed to show the frame which utilizes the invention.

The electronic unit shown in FIG. 1 is a typical central processing unit for an electronic digital computer. A door 1 is attached by means of hinges to a frame assembly 2. Although a single door 1 is shown, such units are provided with a sufficient number of doors and permanent covers so that the entire exterior of frame assembly 2 is covered. In general, doors will be provided at those locations which are convenient for the purpose of maintaining and servicing the electronic and other equipment contained within the confines of frame 2.

The central processing unit typically includes one or more electronic gates 3 which contain large numbers of electronic circuit cards or similar components. These gates are supported on hinges, which do not show in FIG. 1, so that they can be swung open for easy servicing after the doors are opened. Other electronic equipment within frame 2 includes power supplies 4 and a high-speed storage unit 5.

The portion of door 1 which abuts frame 2 is fitted with a finger stock material 6. This material may be held in place on door 1 by means of channels in the door structure, machine screws, rivets or other similar techniques. The primary requirement for the fastening technique is that it provides a low-impedance electrical contact between finger stock 6 and door 1.

Those portions of frame 2 which abut finger stock 6 when door 1 and other doors are closed are provided with a plurality of metal strips 10. These strips are fabricated from a material such as copper or plated steel to provide a conductive surface for engagement with finger stock 6. There are several ways of fastening strips 10 to frame 2 which satisfy the requirements of this invention. In most cases, a mechanical fastening means such as rivets 11 may be used. Such fasteners have the advantage that they provide a stable low-resistance connection from metal strips 10 to frame 2.

Figure 2:
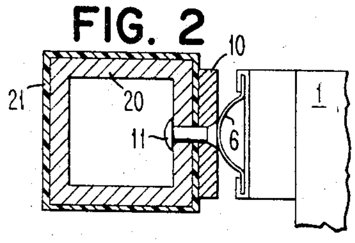
FIG. 2 is a sectional view of a frame member showing the high conductivity strip affixed to the frame by mechanical means together with the finger stock fastened to the door.

The relationship between strips 10 and frame 2 is shown in somewhat greater detail by the sectional view of FIG. 2. This view is taken through a member of frame 2 to show the metal tubular member 20 covered with a layer of conductive paint 21 and having a metal strip 10 affixed by means of rivet 11.

It can be seen that metal strip 10 is spaced from tubular member 20 by the coating of conductive paint 21. An electrical path is provided from metal strip 10 to tubular member 20 through a parallel circuit including both rivet 11 and conductive paint 21.

With typical conductive paints, the electrical path through rivet 11 will provide the lowest impedance path at DC and low frequencies. However, as the frequency is increased and the inductive reactance of this path becomes significant, the path through the conductive paint becomes the lowest impedance. In the usual case, the thickness of conductive paint 21 will be such that the capacitance between strip 10 and member 20 will be substantial. This capacitance serves to decrease the impedance between the strip 10 and tubular member 20 at high frequencies.

Figure 3:
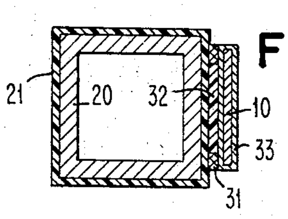
FIG. 3 is a sectional view of a frame member showing the frame, conductive paint, conductivity strip and conductive adhesive.

While the mode of fastening strip 6 as shown in FIGS. 1 and 2 is entirely satisfactory and may even be the preferred embodiment in some situations, there are occasions where it is desirable to avoid the necessity for perforating tubular member 20. One satisfactory alternative is shown in FIG. 3. In the embodiment of FIG. 3, the basic elements of the combination, the tubular member 20, conductive paint 21 and metal strip 10, remain the source. However, strip 10 is fastened to the conductive paint by means of a conductive adhesive 31—epoxy 32 combination.

Since there is no metallic connection between strip 10 and tubular member 20, the DC resistance between these elements is determined solely by the conductive adhesive 31 and conductive paint 21. The DC resistance for this embodiment will be somewhat higher than that for the embodiment shown in FIG. 2, however, the impedance at higher frequencies will approach that of the riveted version.

Depending on the material selected for strip 10, it may or may not be necessary to protect the surfaces with a corrosion resistant material 33 such as cadmium, tin, or nickel.

Figure 4:
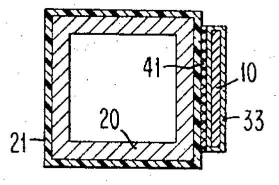
FIG. 4 is a sectional view of another embodiment showing an alternative means for securing the high conductivity strip to the conductive paint.

It is not always necessary to use a combination of conductive adhesive and epoxy. A further embodiment, utilizing only a conductive adhesive, is shown in FIG. 4. This configuration, metal strip 10 is secured to the surface of conductive paint 21 solely by means of a conductive adhesive 41.

This technique is most useful in cases where the thickness of strip 10 is very small; for example, when strip 10 is made from a copper tape.

A suitable conductive tape is available from Tapecon, 745 River Street, Rochester New York. This tape is fabricated from annealed copper foil having a thickness of 0.003 inches. A conductive pressure sensitive adhesive layer about 0.002 inches thick is provided on one side of the tape. The electrical resistance of the adhesive is about 0.005 ohms per square inch. This provides a very low resistance from the tape to the conductive paint.

The embodiments of FIGS. 3 and 4 are particularly useful when it is desired to use the interior of tubular member 20 for the purpose of conveying a cooling fluid from one portion of the unit to another. In addition, the absence of holes cuts the cost of producing the frame and makes it easier to paint.

Figure 5:
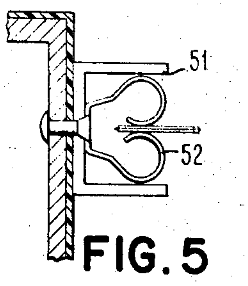
FIG. 5 is a partial sectional view of a frame member showing the high-conductivity strip affixed by mechanical means.

The versatility of this grounding system is shown in the sectional view of FIG. 5. This embodiment resembles that of FIG. 2 except that metal strip 10 has been replaced with channel 51. The finger stock 6, formerly mounted on door 1, is replaced with finger stock 52 secured within channel 51. With finger stock 52 secured to frame 2, a knife blade 53 is fastened to door 1 for the purpose of making electrical contact with the finger stock.

Figure 6:
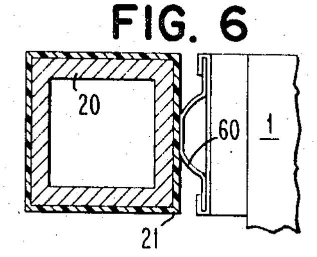
FIG. 6 is a sectional view of a frame member showing an embodiment in which the finger stock attached to the cover also provides a sufficient contact area with the conductive paint so as to render a separate high-conductivity strip unnecessary.

The embodiment shown in FIG. 6 finds use in those situations where doors 1 are opened only frequently. It can be seen that there is direct contact between finger stock 60 and the surface of conductive paint 21. Instead of the relatively small area of contact between finger stock 6 and metal strip 10 in FIG. 2, the embodiment of FIG. 6 provides for a large contact area between these elements. A large contact area such as shown can be obtained by preforming finger stock 60 to an appropriate curve or simply by increasing the pressure of door 1 against frame 2.

The resulting contact area is sufficient to establish a high capacitance between finger stock 60 and tubular member 20. The DC resistance is also low because of the effective paralleling of the paths through the conductive paint to tubular member 20. This configuration is subject to wear because the finger stock bears directly against the paint. Despite this shortcoming, it is acceptable for use in certain situations.

A paint suitable for use in this invention is a conductive epoxy material. In the preferred embodiment, the resin system is a rosin modified phenol formaldehyde type resin. A typical solvent system can be formulated in the following proportions by weight:

| | |
|---|---|
| Acetone | 13% |
| Methanol | 3% |
| Ethanol | 55% |
| Methyl isobutyl ketone | 8% |
| Toluene | 8% |
| Water | 7% |
| Mesityl oxide | 5% |

Conductivity is provided by the addition of carbon granules ranging in size from 10—1000A°. About 10 percent by weight of the final mixture has been found to provide a sufficiently high conductivity without having an adverse effect on the ability to withstand adverse environments.

When the paint has cured, the DC resistance between the tubular member and a small probe in contact with the outer surface of the paint should be within the range of 20 and 1,000 ohms. Lower resistance values are obtained at a sacrifice in the ability of the paint to withstand corrosive environments. Higher resistance provides a less effective grounding system.

The paint can be applied with a spray system in conventional fashion. Scratches can be repaired simply by painting over the damaged area with the same mixture.

Figure 7:
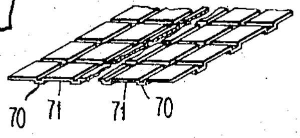
FIG. 7 is a partial view of an embossed tape which can be used as a high-conductivity strip.

As an alternative to the flat tape, it is possible to use an embossed tape such as shown in FIG. 7. In this configuration the high points 70 caused by the embossing make contact with the conductive paint. The spaces 71 between the embossed pattern may be filled with an adhesive. Since electrical contact is made by the high points on the tape, the adhesive can be either conductive or nonconductive.

While the invention has been particularly shown and described with reference to preferred embodiments thereof, it will be understood by those skilled in the art that the foregoing and other changes in form and details may be made therein without departing from the spirit and scope of the invention.

What I claim is:

1. A grounding system for an electronic unit having a conductive frame comprising:
   a coating of conductive paint having a conductivity substantially less than the conductivity of said frame,
   a plurality of metallic strips having a high conductivity,
   means holding said strips in electrical contact with said paint,
   at least one movable cover for said unit,
   means making electrical contact between said cover and said strips.
2. A system according to claim 1 wherein the conductivity of said strips is at least as great as the conductivity of said frame.
3. A system according to claim 2 wherein the means holding said strips in electrical contact with said paint also makes a low-resistance connection between said strips and said frame.
4. A system according to claim 2 wherein said means making electrical contact between said cover and said strips comprises spring finger stock means.
5. A system according to claim 2 wherein said means holding said strips in electrical contact with said paint comprises a conductive adhesive.
6. A system according to claim 2 wherein the DC resistance between said frame and a point in contact with said coating of conductive paint is between 20 and 1000 ohms.
7. A system according to claim 6 wherein the area of at least one of said strips in contact with said conductive paint is sufficient to provide a DC resistance of less than 20 ohms between said frame and a point in contact with said one strip.

8. A system according to claim 2 wherein the DC resistance between said frame and a point in contact with said coating of conductive paint is between 20 and 1,000 ohms, the DC resistance between said frame and a point in contact with said strip is less than 20 ohms, and the area of said strip in contact with said paint is at least great enough to maintain the AC impedance up to 300 MHz. at a value less than the DC resistance between said frame and a point in contact with said strip.

9. A system according to claim 3 wherein the DC resistance between said frame and a point in contact with said coating of conductive paint is between 20 and 1,000 ohms, the DC resistance between said frame and a point in contact with said strip is less than 1 ohm, and the area of said strip in contact with said paint is at least great enough to maintain the AC impedance up to 300 MHz. at a value less than the DC resistance between said frame and a point in contact with said strip.

10. A grounding system for an electronic unit having a conductive frame comprising:

a coating of paint having a conductivity substantially less than the conductivity of said frame, a plurality of strips of metallic tape having a conductivity at least as great as the conductivity of said frame, conductive adhesive means for holding said tape to said conductive paint, at least one hinged movable cover for said unit, means for making electrical contact between said cover and said tape.